(12) United States Patent
Bohlländer

(10) Patent No.: US 11,762,037 B2
(45) Date of Patent: Sep. 19, 2023

(54) IDENTIFICATION OF AN INVERTER SHORT CIRCUIT BETWEEN TWO PHASES

(71) Applicant: Marco Bohlländer, Hirschaid (DE)

(72) Inventor: Marco Bohlländer, Hirschaid (DE)

(73) Assignee: Rolls-Royce Deutschland Ltd & Co KG, Blankenfelde-Mahlow (DE)

( * ) Notice: Subject to any disclaimer, the term of this patent is extended or adjusted under 35 U.S.C. 154(b) by 362 days.

(21) Appl. No.: 17/099,744

(22) Filed: Nov. 16, 2020

(65) Prior Publication Data
US 2021/0148994 A1 May 20, 2021

(30) Foreign Application Priority Data

Nov. 18, 2019 (DE) ..................... 10 2019 217 747.6

(51) Int. Cl.
*G01R 31/52* (2020.01)
*H02M 1/32* (2007.01)
*H02M 7/44* (2006.01)
*H02M 1/00* (2006.01)

(52) U.S. Cl.
CPC ............. *G01R 31/52* (2020.01); *H02M 1/32* (2013.01); *H02M 7/44* (2013.01)

(58) Field of Classification Search
CPC .......... G01R 31/52; H02M 1/32; H02M 7/44; H02M 1/0009
See application file for complete search history.

(56) References Cited

U.S. PATENT DOCUMENTS

| 6,160,414 A * | 12/2000 | Matsubara ........... H02H 7/1227 324/537 |
| 2006/0006899 A1* | 1/2006 | de Larminat ........... H02P 7/282 324/107 |
| 2008/0084215 A1* | 4/2008 | Itten ..................... H02H 7/1227 324/510 |

(Continued)

FOREIGN PATENT DOCUMENTS

| DE | 102011014561 A1 * | 1/2012 | .......... H02P 29/0241 |
| EP | 0848492 A1 | 6/1998 | |

(Continued)

OTHER PUBLICATIONS

German Search Report for German Application No. 10 2019 217 747.6 dated Feb. 28, 2020.

*Primary Examiner* — Sisay G Tiku
(74) *Attorney, Agent, or Firm* — Lempia Summerfield Katz LLC

(57) ABSTRACT

A method for identifying an inverter short circuit between two phases includes measuring AC current values of three phases. Values of a temporal current change are also identified based on the measured AC current values. A short circuit between two phases is then assumed if, in one phase at DC+ and one phase at DC−, the current rises more quickly or falls more quickly than a predetermined threshold value. In order to check this assumption, it is identified whether the value of the identified rise in a first phase possibly affected by the short circuit corresponds to the value of the identified fall in a second phase possibly affected by the short circuit. In the event that the assumption has been positively confirmed, it is also checked whether a current sum of the phases is still unchanged. A short circuit is established when the two checks have proven positive.

12 Claims, 6 Drawing Sheets

(56) References Cited

U.S. PATENT DOCUMENTS

| | | | | |
|---|---|---|---|---|
| 2011/0234126 | A1* | 9/2011 | Meyer, III | H02P 29/0241 |
| | | | | 318/400.3 |
| 2011/0241590 | A1* | 10/2011 | Horikoshi | H02H 7/0838 |
| | | | | 318/490 |
| 2014/0132278 | A1* | 5/2014 | Tang | G01R 31/52 |
| | | | | 324/509 |
| 2016/0254783 | A1* | 9/2016 | Unru | H02S 50/00 |
| | | | | 324/658 |
| 2019/0106002 | A1* | 4/2019 | Götz | B60L 50/60 |
| 2019/0326845 | A1 | 10/2019 | Pokkinen | |
| 2020/0186058 | A1* | 6/2020 | Yukawa | H02P 29/024 |
| 2021/0148990 | A1* | 5/2021 | Bohlländer | G01R 31/52 |
| 2022/0190743 | A1* | 6/2022 | Lu | H02M 1/0025 |

FOREIGN PATENT DOCUMENTS

| | | | | |
|---|---|---|---|---|
| EP | 1832885 | A1 * | 9/2007 | B62D 5/0487 |
| EP | 1936794 | A2 * | 6/2008 | G01R 19/0046 |
| EP | 2830206 | B1 * | 3/2021 | H02H 3/253 |
| EP | 4096079 | A1 * | 11/2022 | |
| JP | 02197294 | A * | 8/1990 | |
| JP | 5057661 | B2 * | 10/2012 | |
| WO | WO-9801944 | A1 * | 1/1998 | G01R 31/346 |

\* cited by examiner

IDENTIFICATION OF AN INVERTER SHORT CIRCUIT BETWEEN TWO PHASES

This application claims the benefit of German Patent Application No. DE 10 2019 217 747.6, filed on Nov. 18, 2019, which is hereby incorporated by reference in its entirety.

BACKGROUND

The present embodiments relate to identifying an inverter short circuit between two phases.

Electric motors are being used increasingly in vehicles and aircraft. Such systems usually have a complex isolé-terre (IT) network, via which, inter alia, the electric motors are also monitored and controlled. Electric motors in such a system are part of the drivetrain, which additionally also includes an inverter. Such an inverter converts a DC voltage, which is provided, for example, by an accumulator battery, into a three-phase voltage, as is used by three-phase current electric motors. If there is a fault in the region of the drivetrain (e.g., a short circuit), this may result in the worst-case scenario in total failure of the electric motor, which may lead to a crash in the case of aircraft. It would therefore be advantageous to promptly detect short circuits in the drivetrain and to initiate countermeasures in order to prevent failure of the electric motor during operation.

One inverter typically installed in a drivetrain is a 3-phase 2-level inverter. FIG. 1 illustrates such an inverter. FIG. 2 additionally shows a vector diagram for such an inverter.

If there is a short circuit between two phases in an alternating current (AC) region between an inverter and a motor of the IT network, then this leads to an overcurrent between the two affected phases as soon as one of the two phases has the polarity DC+ by virtue of one switch of the inverter and the other phase has the polarity DC− by virtue of one switch of the inverter. DC+ and DC− are in this case the two potentials of the contacts of the battery by way of which the IT network is supplied with electric DC current. The short circuit bridges the inductance of the motor installed in the IT network; as a result of this, the effective overall inductance is considerably reduced. A current that rises very quickly per cycle is thereby generated and triggers an overcurrent fault within a few cycles. This provides that the overall inverter is put into a safe state with pulse blocking. In this case, either all of the switches of the inverter are set to "Off" or an active winding short circuit is generated; all of the DC+ or all of the DC− switches of the inverter are set to "On", and the others are set to "Off" (e.g., "active winding short circuit"). As a result of this measure, the motor becomes free from torque, and the drive function is lost. UDC positive and UDC negative are in this case the potentials of the contacts of the DC voltage source used as energy source in the IT network.

The switch-off measures are essential in the prior art since, in the case of a phase-to-phase short circuit, hazardous overcurrents may occur within a very short time (e.g., in a few 10 µs to at most a few ms). As a result of this, the inverter may be destroyed if the short circuit is not recognized promptly, and countermeasures are initiated.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a method and an arrangement for identifying and compensating an inverter short circuit between two phases, in which, in the case of a short circuit, damage to the inverter is avoided, but the function of the rest of the system is as far as possible maintained in spite of the short circuit are provided.

In the case, for example, of the operation of an electric aircraft, such as, for example, a multicopter, the functionality of the rest of the system may be critical to the safety thereof.

A method for identifying an inverter short circuit between two phases according, a method for reconfiguring an energy supply network affected by a short circuit between two phases, an arrangement for identifying an inverter short circuit between two phases, and a reconfiguration arrangement are provided.

In the method according to the present embodiments for identifying an inverter short circuit between two phases, AC current values of all three phases in an energy supply network are measured. The electrical network to be tested has two current circuits separated by an inverter, a first current circuit of which includes a DC current circuit that is connected to a voltage source with the contact voltages DC+ and DC−, and a second current circuit of which includes a three-phase current circuit that is supplied with phase-offset AC voltages by the bridge circuit of the inverter. The AC current values thus result in temporally changeable and phase-shifted current strength values.

Values of a temporal current change are also identified based on the measured AC current values. A short circuit between two phases is then assumed if, when a phase is put into contact with DC+ by the inverter circuit, the measured electric current rises more quickly than a predetermined threshold value and, when a phase is put into contact with DC− by the inverter circuit, the measured electric current falls more quickly than a predetermined threshold value. DC+ and DC− are in this case the electrical potentials present at the DC current circuit of the energy supply network. The threshold value results from the basic relationship $$U = L \cdot \frac{dI}{dt}, \qquad (1)$$

where L is the inductance of the electrically operated functional system (e.g., an electric motor), U is the DC voltage or intermediate circuit voltage of the inverter, and dI/dt is the temporal current strength change. In one cycle width dt, the current may change by at most dI=U/L*dt. In the event of a short circuit, the effective inductance L is suddenly reduced, and so the current rise dI also changes while the voltage U remains the same. In the case of a known intermediate circuit voltage U, a maximum current of I2=I1+dI is therefore able to be achieved, where I2 is the current in the following cycle and I1 is the current in the current cycle, if no short circuit occurs. If the current rise goes beyond this maximum value, this is an indication of a short circuit. The threshold value may thus also depend, for example, on the current DC voltage U.

In order to check this assumption, it is identified whether the value of the identified rise in a first phase possibly affected by the short circuit corresponds to the value of the identified fall in a second phase possibly affected by the short circuit. In the event that the assumption has been positively confirmed, it is also checked whether the current sum of the phases is still unchanged. A short circuit is finally established if both checks have proven positive.

A short circuit between two phases is usually identified only when the phase currents have reached an overcurrent switching threshold. In order to achieve damage to the inverter, all of the switches of the bridge circuit of the inverter are then switched to "Off", such that current is no longer transmitted to the motor and the motor coasts to a stop since the motor then generates only a stray braking torque. Only one phase may then conventionally also exhibit an overcurrent, such that the phases between which the short circuit is present are unclear.

The identification method according to the present embodiments may be performed continuously during operation (e.g., the acts described above are continually repeated during operation). An AC current sensor is to be provided for each of the three phases to measure the AC current values. In the method according to the present embodiments, it is possible to unambiguously determine the phase on which the short-circuit current occurs. Countermeasures are thereby able to be taken in a targeted manner in the course of a reconfiguration in order to prevent any damage to the functional system supplied with electrical energy by the electrical energy supply network, and additionally the failure thereof.

In the method according to the present embodiments, for reconfiguring an energy supply network affected by a short circuit between two phases, phases that are short-circuited with one another are located using the method according to the present embodiments for identifying an inverter short circuit between two phases.

A modulation of the inverter is also modified such that the occurrence of an overcurrent is avoided. The modulation may be influenced by changing the control of the switches. The short-circuited phases are clocked such that all of the switch settings with a switch setting opposing the phases affected by the short circuit are avoided. The current loading is thereby able to be reduced in the event of a short circuit (e.g., an overcurrent is able to be avoided, and the function performed by the energy supply network, such as a motor function, is still able to be maintained).

The arrangement according to the present embodiments for identifying an inverter short circuit between two phases has at least three AC current measurement units for measuring and evaluating AC current values of all three phases. One part of the arrangement according to the present embodiments for identifying an inverter short circuit between two phases is also a current change value identification unit that identifies values of a temporal current change based on the measured AC current values. The arrangement according to the present embodiments for identifying an inverter short circuit between two phases also includes a short circuit candidate identification unit that creates a first assumption with regard to a short circuit between two phases if, when a phase is put into contact with DC+ by the inverter circuit, the measured electric current rises more quickly than a predetermined threshold value and, when a phase is put into contact with DC− by the inverter circuit, the measured electric current falls more quickly than a predetermined threshold value. In this connection, "fall more quickly" may not just be down to the value 0, but may also be that a value below 0 may tend toward higher negative values in absolute terms. The same also applies to the fall.

One part of the arrangement according to the present embodiments for identifying an inverter short circuit between two phases is also a first plausibility-checking unit for checking the assumption by identifying whether the value of the identified rise corresponds to the value of the identified fall. The arrangement according to the present embodiments for identifying an inverter short circuit between two phases also includes a second plausibility-checking unit for checking, in the event that the assumption has been positively confirmed, whether the current sum of the phases is still unchanged. The arrangement according to the present embodiments for identifying an inverter short circuit between two phases has a short circuit identification unit for establishing a short circuit if the two checks have proven positive.

The arrangement according to the present embodiments for identifying an inverter short circuit between two phases shares the advantages of the method according to the present embodiments for identifying an inverter short circuit between two phases.

The reconfiguration arrangement according to the present embodiments has the arrangement according to the present embodiments for identifying a short-circuited phase. One part of the reconfiguration arrangement according to the present embodiments is also a modification unit for modifying the modulation of the inverter such that the AC short-circuit current is reduced. The reconfiguration arrangement according to the present embodiments shares the advantages of the method according to the present embodiments for reconfiguring an energy supply network affected by a short circuit between two phases.

Some parts of the arrangement according to the present embodiments for identifying an inverter short circuit between two phases and of the reconfiguration arrangement according to the present embodiments may for the most part be configured in the form of software components, possibly with the addition of necessary hardware components. This applies, for example, to parts of the current change value identification unit, parts of the short circuit candidate identification unit, parts of the first plausibility-checking unit, parts of the second plausibility-checking unit, and parts of the short circuit identification unit and of the modification unit. These components may, however, also be implemented partly in the form of software-supported hardware (e.g., FPGAs or the like; when particularly fast calculations are required). The required interfaces may likewise be configured as software interfaces (e.g., when it is required only to transfer data from other software components). The required interfaces may, however, also be configured as interfaces in the form of hardware that are driven by suitable software.

An implementation partly in the form of software has the advantage that computer systems already previously used in energy supply networks are also easily able to be retrofitted by adding hardware units for measuring current strengths through a software update in order to operate in the manner according to the present embodiments. In this respect, a corresponding computer program product containing a computer program that is able to be loaded directly into a storage apparatus of such a computer system is provided. The computer program product contains program sections for executing all of the acts of the method for identifying an inverter short circuit between two phases and all of the acts of the method for reconfiguring an energy supply network affected by a short circuit between two phases when the computer program is executed in the computer system.

Such a computer program product may possibly include, in addition to the computer program, additional parts, such as, for example, documentation and/or additional components, including hardware components, such as, for example, hardware keys (e.g., dongles, etc.) for using the software.

For transportation to the storage apparatus of the computer system and/or for storage on the computer system, use may be made of a computer-readable medium (e.g., a memory stick, a hard disk or another transportable or fixedly installed data carrier on which those program sections of the computer program that are able to be read and executed by a computer unit are stored). The computer unit may have, for example, one or more interacting microprocessors or the like.

The claims of one claim category may, for example, also be developed analogously to the claims of another claim category. In addition, in the context of the present embodiments, the various features of different exemplary embodiments and claims may also be combined to form new exemplary embodiments.

In one variant of the method according to the present embodiments for identifying an inverter short circuit between two phases, it is checked, when checking the current sum for the case of an IT network, whether the current sum of all of the phases gives the value 0.

If the current sum additionally continues to remain unchanged at zero, then this is a strong indication that the sensors are still working (e.g., measurement is performed correctly), and there is no short circuit to ground (e.g., current flows elsewhere) or other faults. This should be an indication that it is safer not to carry out any reconfiguration through remodulation, but rather it is better to perform pulse blocking and thus to enter freewheeling mode in order not to cause any more damage in the event of an incorrect diagnosis. A reconfiguration that is as accurate as possible is based on a diagnosis that is as accurate as possible (e.g., including ruling out incorrect interpretations).

In the case of a network with a neutral conductor, it may additionally be checked whether the current sum of all of the phases gives an unchanged value, occurring before the assumed short circuit, of other than 0.

The short circuit may be located between the phases for which the value of the identified rise in the AC current in one phase corresponds to the value of the identified fall in the current in the other phase. If this is not the case, it may be concluded therefrom that the two phases are not short-circuited with one another. An incorrect short circuit diagnosis is thereby able to be avoided.

In one variant of the method according to the present embodiments for reconfiguring an IT network affected by a short circuit between two phases, when modulating the inverter, space vector settings corresponding to the avoided switch settings are replaced with null vector settings. In the case of operating an electric motor, when the null vector is set, the electric motor drifts at a sufficiently high rotational speed through the region in which a short circuit would otherwise be generated at the inverter. Although in this case there may be performance losses, there is not total failure of the drive function, such that operation of the electric motor is able to be maintained.

DETAILED DESCRIPTION

Figure 1:
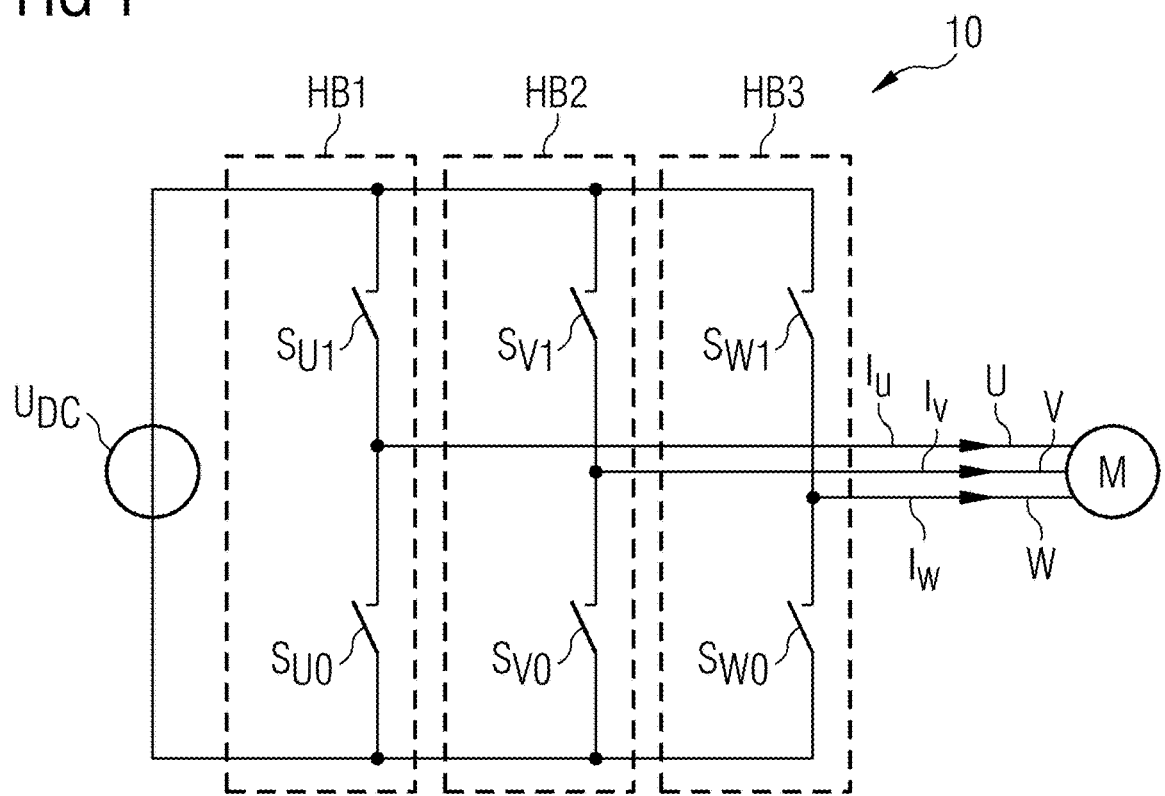
FIG. 1 shows a schematic illustration of one embodiment of a 3-phase 2-level inverter.

FIG. 1 shows a schematic illustration of one embodiment of a three-phase system. Such a three-phase system has a half-bridge HB1, HB2, HB3 for each of the three phases. By switching the half-bridges HB1, HB2, HB3, an output voltage of the individual phases U, V, W is able to be set both to a positive intermediate circuit potential DC+ and to a negative intermediate circuit potential DC− (the intermediate circuit voltage is denoted "UDC" in FIG. 1). As may be seen in the circuit, only one switch $S_{U0}$, $S_{U1}$, $S_{V0}$, $S_{V1}$, $S_{W0}$, $S_{W1}$ may ever be closed in each half-bridge, since otherwise, the intermediate circuit voltage UDC within the half-bridge is short-circuited. For the further comments, it is assumed that a respective switch $S_{U0}$, $S_{U1}$, $S_{V0}$, $S_{V1}$, $S_{W0}$, $S_{W1}$ is closed in each half-bridge HB1, HB2, HB3. A certain potential is thus present in each phase at each time. Each half-bridge HB1, HB2, HB3 may therefore adopt two states. In the first state, the upper switch $S_{U1}$, $S_{V1}$, $S_{W1}$ is closed, and in the second state, the lower switch $S_{U0}$, $S_{V0}$, $S_{W0}$ is closed.

At the time of the switchover between the switched-on state of the upper half-bridge and the switched-on state of the lower half-bridge, the switch that is currently switched on first of all has to be switched off. There is then a very short wait until the other switch is then switched on. This is a bridge locking time, during which both switches are switched to "Off" within the half-bridge. This is very short in comparison with the cycle time (e.g., of the order of magnitude of approximately 1% of the cycle time).

Each half-bridge HB1, HB2, HB3 may adopt two different switch settings. Since three half-bridges are required for a three-phase current system, this results in $2^3$ possible switch settings and thus 8 switching states. At each switch setting, this results in a different voltage constellation at the motor between the phases U, V, W and thus also a different voltage space vector. The two switch settings in which either all three upper switches $S_{U1}$, $S_{V1}$, $S_{W1}$ or all three lower switches $S_{U0}$, $S_{V0}$, $S_{W0}$ are closed constitute an exception. In these switch settings, all three phases are short-circuited. It is thus not possible to measure any voltage, or any voltage as a first approximation, between the phases. These two voltage vectors are referred to as null voltage space vectors.

Figure 2:
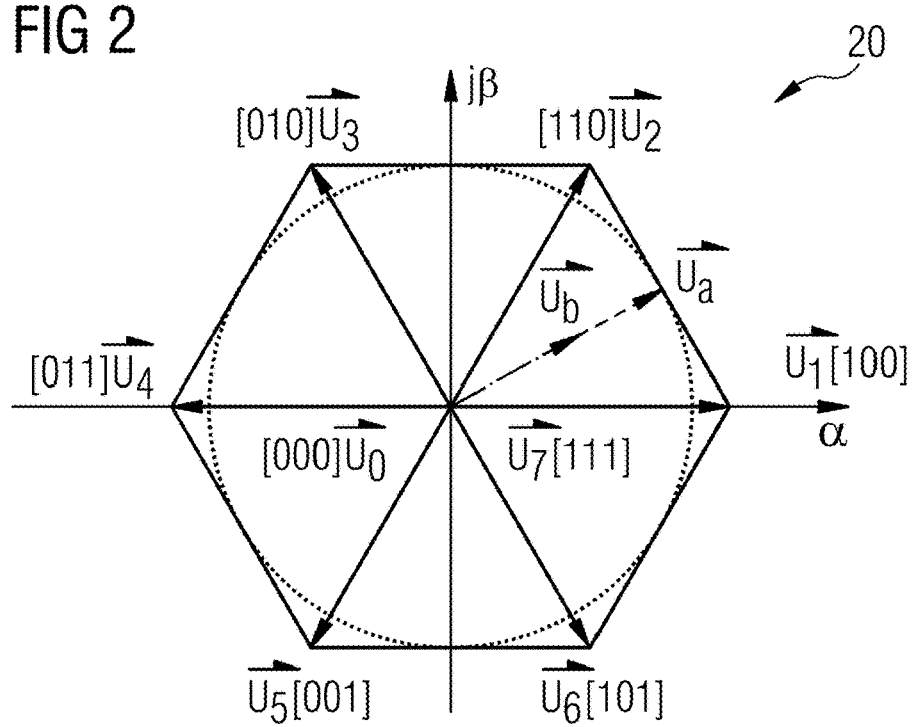
FIG. 2 shows a schematic illustration of an exemplary vector diagram of a 3-phase 2-level inverter.

FIG. 2 shows a schematic illustration of a vector diagram 20 of a 3-phase 2-level inverter. The vector diagram 20 shows the individual voltage space vectors that may be set in the case of a three-phase two-level inverter.

Such a three-phase system (see FIG. 2) may be implemented using three half-bridges HB1, HB2, HB3 connected in parallel. The individual phases are assigned different vectors. [100] provides, for example, that the three phases U, V, W are switched to U+, V− and W−. One revolution corresponds to one full electrical rotation of an electrical machine (e.g., an electric motor). A total of eight base voltage vectors $U_0$ to $U_7$ are illustrated. $U_0$ and $U_7$ are null voltage space vectors, in the case of which it is not possible to measure any voltage between the phases. There are also six active voltage space vectors $U_1$ to $U_6$. The table below depicts in each case the chained output voltages from the eight switch settings that may occur.

| Base voltage space vector | Half-bridge 1 $SU_1/SU_0$ | Half-bridge 2 $SV_1/SV_0$ | Half-bridge 3 $SW_1/SW_0$ | $U_{UV}$ | $U_{VW}$ | $U_{WU}$ |
|---|---|---|---|---|---|---|
| $U_0$ | 0 | 0 | 0 | 0 V | 0 V | 0 V |
| $U_1$ | 1 | 0 | 0 | $+U_{DC}$ | 0 V | $-U_{DC}$ |
| $U_2$ | 1 | 1 | 0 | 0 V | $+U_{DC}$ | $-U_{DC}$ |
| $U_3$ | 0 | 1 | 0 | $-U_{DC}$ | $+U_{DC}$ | 0 V |
| $U_4$ | 0 | 1 | 1 | $-U_{DC}$ | 0 V | $+U_{DC}$ |
| $U_5$ | 0 | 0 | 1 | 0 V | $-U_{DC}$ | $+U_{DC}$ |
| $U_6$ | 1 | 0 | 1 | $+U_{DC}$ | $-U_{DC}$ | 0 V |
| $U_7$ | 1 | 1 | 1 | 0 v | 0 V | 0 V |

The basic principle is that of generating a rotating field in the motor: Three individual electromagnetic fields are generated in the motor from the three individual sinusoidal currents, phase-shifted by 120° with respect to one another, of the individual phases. These are overlaid to form a resultant revolving rotating field that generates the torque. The currents are generated by applying voltages to the motor inductance in a targeted manner.

To achieve this, the basic principle of space vector modulation is applied in the prior art. If it is desired, for example, to output a voltage space vector $U_a$ that has exactly half the angle of the voltage space vector $U_1$ and $U_2$, this voltage space vector $U_a$ may be created by alternately outputting the base voltage space vector $U_1$ and the base voltage space vector $U_2$. The duration for which each voltage space vector is applied depends on the switching frequency of the modulation. What is decisive for the resultant voltage space vector is just the ratio between the two times for the respective base voltage space vectors $U_1$ and $U_2$. If the voltage space vector $U_a$ is thus intended to be located precisely between the two voltage space vectors $U_1$ and $U_2$, then the two times are thus to be selected to be of exactly equal length in order to achieve the desired voltage space vector. The low-pass effect of the stator windings results, in the three-phase current machine, in an averaged current and thus the desired space vector.

The control logic is thus to initially check in which of the six sectors the desired voltage space vector is located, and alternately, output the two relevant base voltage space vectors. The ratio between the times for which each of the two base voltage space vectors $U_1$, $U_2$ is to be applied results from the relative angle of the desired voltage space vector with respect to the angles of the relevant base voltage space vectors.

If the amplitude of the output voltage (e.g., also the magnitude of the voltage space vector) is intended to be selected as desired, then the null voltage space vectors $U_0$, $U_7$ are also to be provided. If it is then desired, for example, to output the voltage space vector $U_b$, then the ratio between the output times of the base voltage space vectors $U_1$ and $U_2$ is to be exactly equal. In order to be able to reduce the magnitude of the resultant voltage space vector $U_b$, an additional time is introduced in which a null voltage space vector is output. The magnitude of the resultant voltage space vector thus depends on the ratio between the switched-on time of the active base voltage space vector and the switched-on time of the null voltage space vector.

To output any desired voltage space vectors, each switching period is divided, for example, into three time intervals. In two of these time intervals, the two active voltage space vectors are output, and in the third time interval, a passive voltage space vector (e.g., a null voltage space vector $U_0$, $U_7$) is output. The three voltage space vectors that are involved are thus pulse width-modulated.

A modulation in which a cycle is started at the null vector and also ended at the null vector is particularly commonly selected in the prior art. The vector/time areas therefore do not change, since only the null vector time is divided into two time sections. Thus, there are, for example, then four time voltages per cycle.

Figure 3:
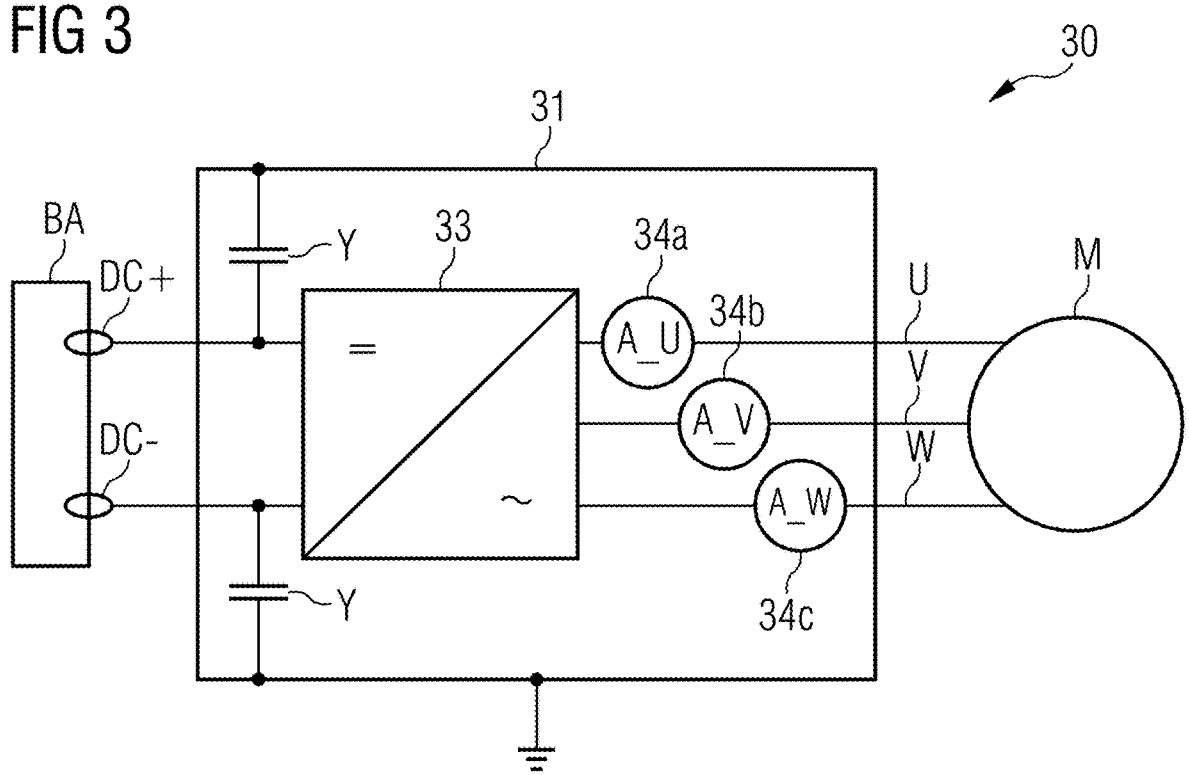
FIG. 3 shows a schematic illustration of one embodiment of an inverter in an IT network drivetrain.

FIG. 3 shows a schematic illustration of an IT network drivetrain 30 for supplying energy to an electric motor M. The arrangement 30 includes an inverter 31 as central component. The inverter 31 is installed in a housing, which is usually made from metal and is grounded. The arrangement includes a battery BA that provides a DC voltage across the two terminals DC+, DC−. The inverter 31 is connected to the DC voltage of the battery BA. The inverter 31 includes a bridge circuit 33 that has the structure illustrated in FIG. 1. Also forming part of the inverter 31 are two Y-capacitors Y that galvanically isolate the DC voltage side of the inverter 31 with respect to the housing, but capacitively couple the DC voltage side of the inverter 31 thereto and thus provide voltage symmetry of DC+ and DC− of the IT network with respect to ground. Three AC current measurement units 34a, 34b, 34c are located on the output side of the bridge circuit 33 (e.g., to the right of the bridge circuit 33 of the inverter 31). Each of the AC current measurement units 34a, 34b, 34c measures the AC current in one of the phase lines U, V, W of a three-phase current. The three-phase current is forwarded by the inverter 31 to a three-phase current motor M. If a short circuit occurs (e.g., between the phase U and the phase V), then the current in the phase U, when connected to DC+, for example, rises greatly and falls greatly when connected to DC−. The same applies to the phase V. The phase W, not affected by the short circuit, exhibits an unchanged current.

Figure 4:
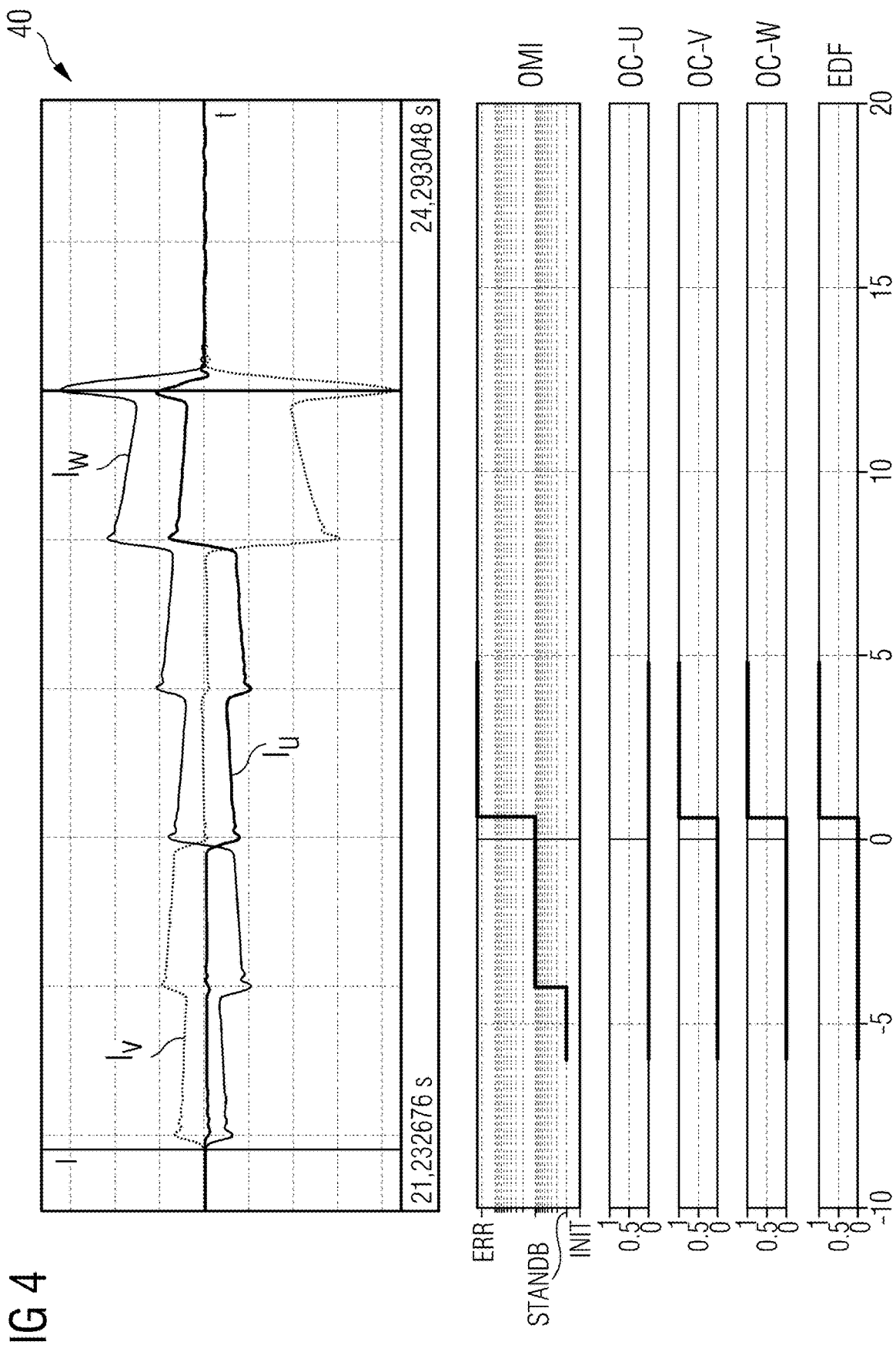
FIG. 4 shows an illustrative diagram of a current measurement and of a result of a short circuit test between different phases in a drivetrain according to the prior art.

FIG. 4 shows an exemplary oscillogram 40 of a result of a conventional short circuit test between all three phases in a three-phase drivetrain. The oscillogram 40 shows a measurement result of a short circuit test performed on a test bench with a drivetrain inserted into a prototype. The upper field of the illustrative diagram shows the three phase currents $I_u$, $I_v$, $I_w$. Each of the individual phases exhibits a strong rise in the current per cycle. Starting from a particular value, an absolute value, which is identified as overcurrent, is measured in the V-phase and the W-phase.

It is seen, for example, that ultimately, in the case of the high currents (e.g., last cycle), $I_v$ falls to the same extent as the sum of $I_u+I_w$ rises (this corresponds, in the discussion described further above, to the vector position [101] actively driving the current). The current in this case flows through the phases U and W into the short-circuit nodes and back out, in sum form, through the phase V and back into the inverter. In the regions of spontaneously increasing current (e.g., $dI/dt=U/L$, with a very small value of L), the voltage drives the current high very quickly. In the time ranges that are temporally predominant, alternating therewith, containing current values that continue to drop slightly toward the null line, the null space vector is applied.

In the application, only switching off into the freewheeling mode would help here (e.g., three-phase short circuit). A reconfiguration that continues to drive the motor is not possible or not known.

The behavior observed in the case of the three-phase short circuit differs from the two-phase short circuit dealt with by the method according to the present embodiments only in that, in the case of the two-phase short circuit, one of the phases is not involved in the short circuit, and the return current is therefore not split over two phases, but rather flows through just a single phase. If, for example, only the phase W, but not phase U were to be short-circuited to form magenta phase W, then the current in the phase U would be pleasantly smooth in the image (e.g., smoothed by the motor inductance, without unexpected ripple current caused by the switching), but the two short circuit phases would exhibit complementary behavior.

In the second field from the top, which is denoted operation mode inverter (OMI), an illustration is given as to how the inverter transitions from the "active" state (STANDB) to the "fault" state (ERR). In the fault state, the switches of the bridge circuit are all set to "Off", and the motor rotates in freewheeling mode. The respective state of the respective phase is illustrated below the illustration of the fault state in three lines that are denoted OC-U, OC-V, OC-W. For the phases V and W, it is in each case reported that an overcurrent is present (OC). No overcurrent is reported for the phase U.

A fault event is indicated in the lower line, this being denoted "EDF".

The step function in the lower line, which is denoted event driver fault (EDF) (e.g., bridge circuit fault event) provides that a sum fault has been identified and all of the phases are blocked on the pulse side.

Figure 5:
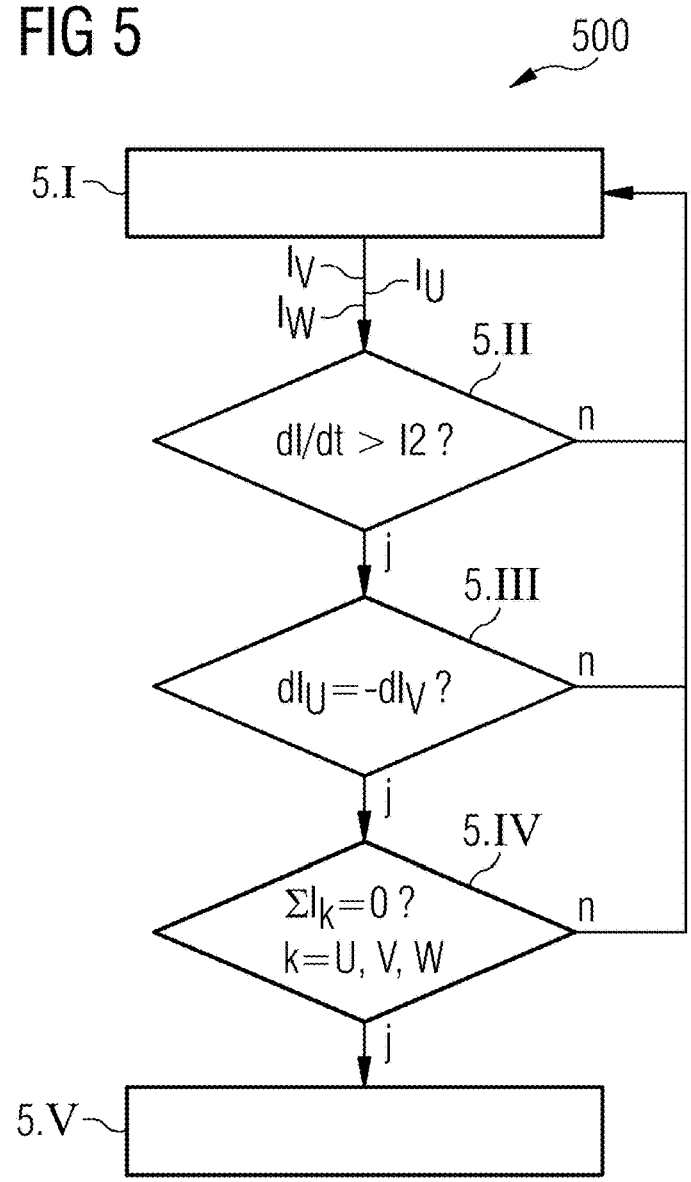
FIG. 5 shows a flowchart that illustrates a method for identifying a short circuit between two phases according to one exemplary embodiment.

FIG. 5 illustrates a flowchart 500 that illustrates a method for identifying a phase-to-phase short circuit in an IT network according to one exemplary embodiment. In act 5.I, currents $I_U$, $I_V$, $I_W$ of all three phases of the IT network (see FIG. 3) are measured. In act 5.II, the AC current sensor values are evaluated such that it is identified whether the temporal change in the currents exceeds an expected value I2. A required condition for the occurrence of a phase-to-phase short circuit current is that such a strong current rise may be observed in at least two phases. If it is identified in act 5.II that there is possibly a phase-to-phase short circuit, this being denoted "y" in FIG. 5, then there is a transition to act 5.III. If it is identified in act 5.II that no strong current rise may be observed, this being denoted "n" in FIG. 5, then there is a return to act 5.I, and the monitoring process illustrated in FIG. 5 is performed again at act 5.I.

In act 5.III, it is further checked whether the rise $dI_U$ in the phase U corresponds to the fall $dI_V$ in the phase V. If it is identified in act 5.III that the rise and fall are equal in terms of absolute value, besides any measurement errors in the sensors to be evaluated that remain within the low single-digit percentage range, this being denoted "y" in FIG. 5, then there is a transition to act 5.IV. If it is identified in act 5.III that the two values are not equal in terms of magnitude, this being denoted "n" in FIG. 5, then there is a return to act 5.I, and the monitoring process illustrated in FIG. 5 is performed again at act 5.I.

In act 5.IV, it is identified, as a third required condition, whether the sum current of the three phases U, V, W gives the value 0. If it is identified in act 5.IV that the sum current gives the value 0, this being denoted "y" in FIG. 5, then there is a transition to act 5.V. If it is identified in act 5.IV that the sum of the phase currents $I_U$, $I_V$, $I_W$, in the context of the measurement inaccuracy and a certain safety margin, does not give the value 0, this being denoted "n" in FIG. 5, then there is a return to act 5.I, and the monitoring process illustrated in FIG. 5 is performed again at act 5.I.

If it was determined in act 5.IV that a short circuit was present, this being denoted "y" in FIG. 5, then a reconfiguration based on the short circuit diagnosis that was made is performed in act 5.V. If such a short circuit is not confirmed in act 5.IV, this being denoted "n" in FIG. 5, then there is a return to act 5.I, and the monitoring process illustrated in FIG. 5 is continued at act 5.I.

Figure 6:
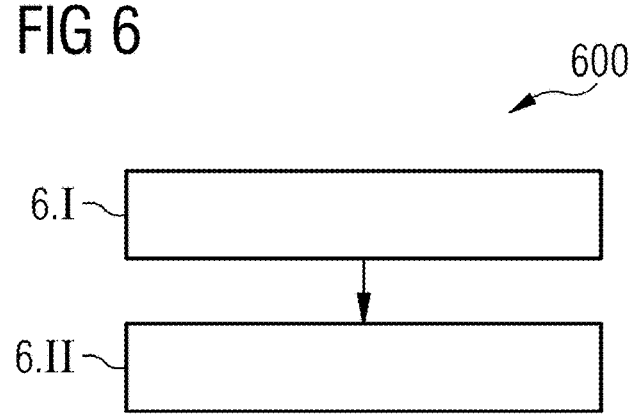
FIG. 6 shows a flowchart that illustrates a method for reconfiguring an IT network following a short circuit between two phases according to a first exemplary embodiment.

FIG. 6 shows a flowchart 600 that illustrates one embodiment of a method for reconfiguring an IT network following a short circuit identified using the method shown in FIG. 5. In act 6.I, a short circuit is identified using the method illustrated in FIG. 5. When identifying the short circuit between two phases, the phases between which the short circuit occurs are also determined. In act 6.II, a reconfiguration may then be performed in a targeted manner, where all of the switch settings of the phases affected by the short circuit are avoided in the course of the reconfiguration when modulating the switch settings of the bridge circuit of the inverter. Continued operation of the system is thereby made possible, which, for example, in the case of the operation of electric aircraft, such as, for example, multicopters, greatly increases the safety thereof.

Figure 7:
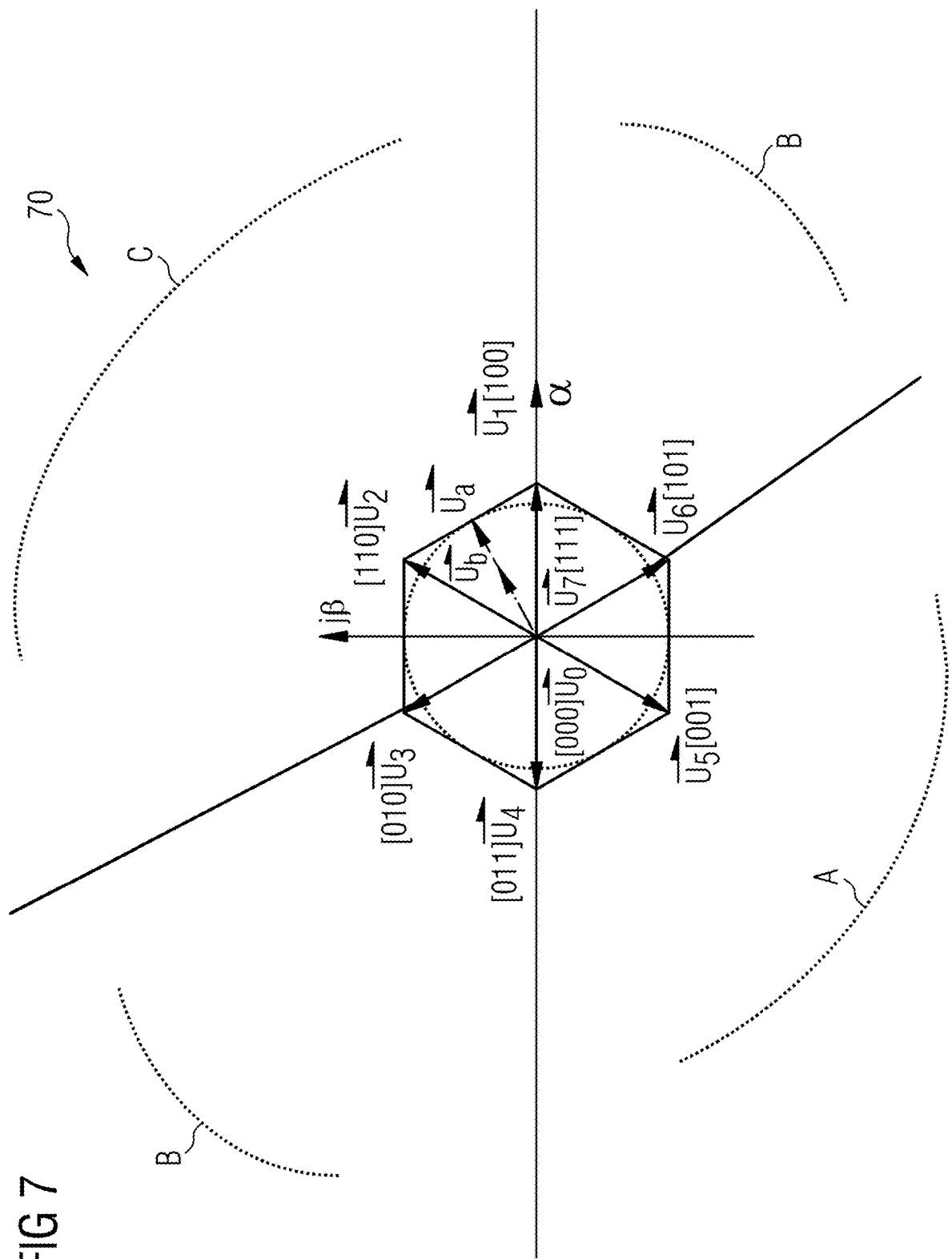
FIG. 7 shows a schematic illustration of an exemplary vector diagram of an inverter with a reconfiguration in the case of a short circuit between two phases.

FIG. 7 shows a schematic illustration of an exemplary vector diagram of an inverter with a reconfiguration in the case of a short circuit between two phases. The vector diagram has different sectors A, B, and C. Sector A has the characteristic that the phase w is in this case at DC+. The two sectors B are transition regions in which the phase w is switched over to DC−. In sector C, the phase w is at DC−. If, for example, a short circuit is then detected between the phases U and V, then vectors with the configuration [101], [100], [011], and [010] are avoided in the reconfiguration. This provides that a certain energy transfer to the motor is still possible in regions A and C, whereas the rotor of the motor is only moved through drive-free drift in regions B.

Figure 8:
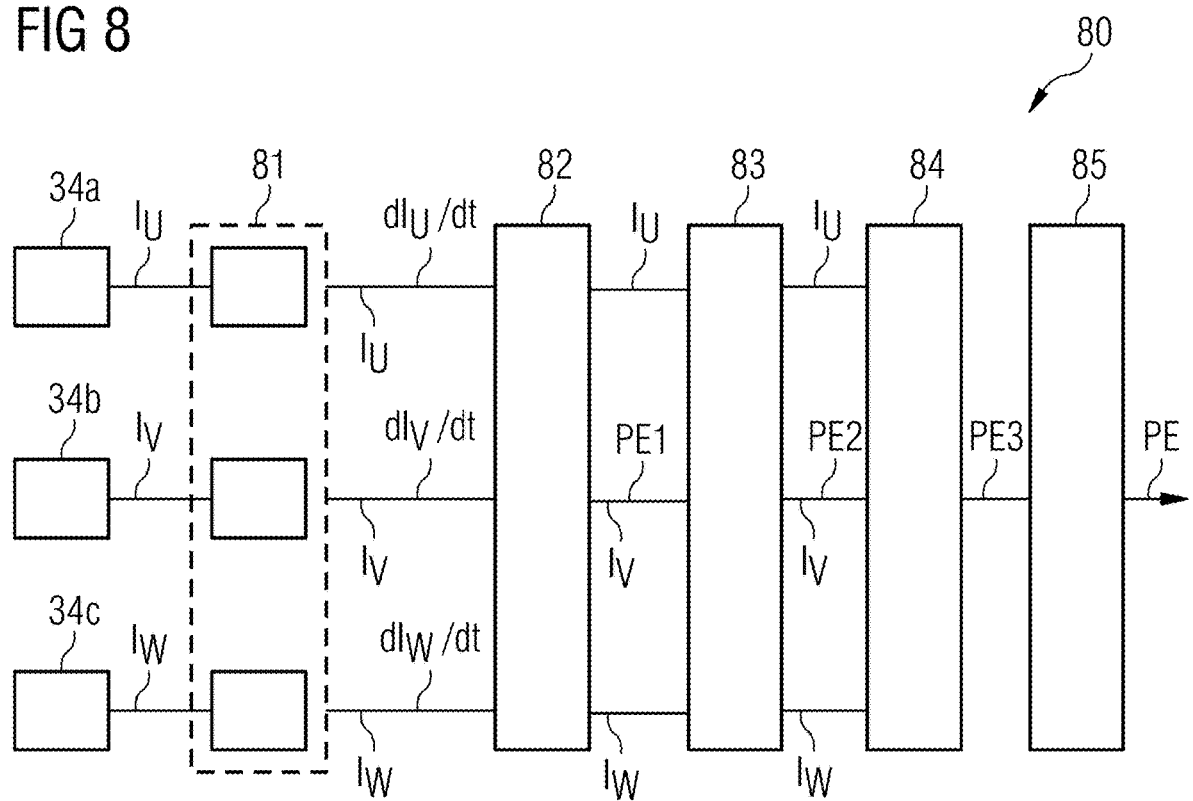
FIG. 8 shows a schematic illustration of an arrangement for identifying an inverter short circuit between two phases according to one exemplary embodiment.

FIG. 8 schematically illustrates one embodiment of an arrangement 80 for identifying an inverter short circuit between two phases. The arrangement 80 has three AC current measurement units 34a, 34b, 34c. The AC current measurement units 34a, 34b, 34c, as shown in FIG. 3, are arranged on that side of the IT network 30 to which three-phase current is applied. The AC current measurement units 34a, 34b, 34c measure AC current values $I_U$, $I_V$, $I_W$ of all three phases U, V, W. The arrangement 80 also has a current change value identification unit 81. This identifies values $dI_U/dt$, $dI_V/dt$, $dI_W/dt$ of a temporal current change based on the measured AC current values $I_U$, $I_V$, $I_W$. The identified values $dI_U/dt$, $dI_V/dt$, $dI_W/dt$ are transmitted to a short circuit candidate identification unit 82 that assumes a short circuit between two phases U, V, W if, in a phase U, V, W at DC+ and a phase U, V, W at DC−, the current rises more quickly or falls more quickly than a predetermined threshold value I2. DC+ and DC− are in this case the DC voltages at the contacts of the battery that are put into electrical contact with the respective phases U, V, W via the switches of the bridge circuit of the inverter. The identified preliminary check result PE1 and the current values $I_U$, $I_V$, $I_W$ are transferred to a first plausibility-checking unit 83 that checks the first check result PE1 by identifying, for the phases U, V for which the short circuit is assumed, whether the value of the identified rise in one phase U corresponds to the value of the identified fall in the other phase V. If the first check result PE1 is confirmed, then a second check result PE2, which includes this confirmation, is generated and transmitted, together with the identified current strength values $I_U$, $I_V$, $I_W$, to a second plausibility-checking unit 84. The second plausibility-checking unit 84, in the event that the assumption has been positively confirmed, checks whether the current sum $I_U+I_V+I_W$ of the phases U, V, W gives the value "0". This applies to an IT network that is configured without a null conductor. Based on this check, a third check result PE3 is transmitted to a short circuit identification unit 85, which establishes, based on the third check result PE3, that a short circuit has occurred between two phases U, V and between which phases U, V the short circuit has occurred, and outputs the end result PE.

Figure 9:
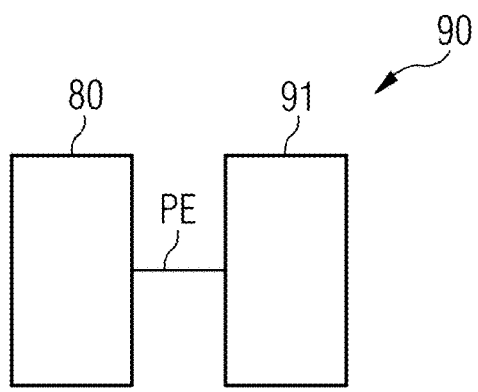
FIG. 9 shows a schematic illustration of a reconfiguration arrangement according to one exemplary embodiment.

FIG. 9 shows one embodiment of a reconfiguration arrangement 90. The reconfiguration arrangement 90 includes the arrangement 80 shown in FIG. 8 for identifying an inverter short circuit between two phases. The reconfiguration arrangement 90 also includes a modification unit 91. The modification unit 91 serves to modify the modulation behavior of the inverter 31 (see FIG. 3) such that an overcurrent in the phases affected by the short circuit is avoided. The modification is achieved by changing the duty cycle of the pulse width modulation in order to drive the switches of the inverter 31 of the IT network 30 (see FIG. 3). The modification is explained in detail in connection with FIG. 6. For the modification, the modification unit 90 receives a check result PE from the arrangement 80 for identifying an inverter short circuit between two phases. Based on the check result, the switch setting of the bridge circuit of the inverter of the IT network is selected such that an overcurrent is avoided.

The above-described methods and devices are merely exemplary embodiments of the invention, and the invention may be varied by a person skilled in the art without departing from the field of the invention. The use of the indefinite article "a" or "an" does not rule out the fact that the features in question may also be present multiple times. Likewise, the term "unit" does not exclude this consisting of a plurality of components that may possibly also be spatially distributed.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for identifying an inverter short circuit between two phases, the method comprising:
   measuring AC current values of all three phases;
   identifying values of a temporal current change based on the measured AC current values;
   assuming a short circuit between the two phases when, in a first phase of the two phases, the measured AC current value rises more quickly than a predetermined threshold value when the first phase is put into contact with DC+ by an inverter circuit and, in a second phase of the two phases, the measured AC current value falls more quickly than a predetermined threshold value when the second phase is put into contact with DC− by the inverter circuit;
   checking the assumption, the checking of the assumption comprising identifying whether a value of the identified rise in the first phase possibly affected by the short circuit corresponds to a value of the identified fall in the second phase possibly affected by the short circuit;
   when the assumption has been positively confirmed, checking whether a current sum of the three phases is still unchanged; and
   establishing the inverter short circuit when the two checkings are positive.

2. The method of claim 1, wherein, in the checking of the current sum for the case of an IT network, the method further comprises checking whether the current sum of all of the three phases gives a value 0.

3. The method of claim 1, wherein, in the checking of the current sum for the case of a network with a neutral conductor, the method further comprises checking whether the current sum of all of the three phases gives an unchanged value, already occurring before the assumed short circuit, of other than 0.

4. The method of claim 1, wherein the inverter short circuit is located between phases of the three phases for which a value of the identified rise in the AC current in one phase corresponds to a value of the identified fall in the current in the other phase.

5. A method for reconfiguring an IT network affected by a short circuit between two phases, the method comprising:
   identifying short-circuited phases using a method for identifying an inverter short circuit between two phases, the method for identifying the inverter short circuit comprising:
   measuring AC current values of all three phases;
   identifying values of a temporal current change based on the measured AC current values;
   assuming a short circuit between the two phases when, in a first phase of the two phases, the measured AC current value rises more quickly than a predetermined threshold value when the first phase is put into contact with DC+ by an inverter circuit and, in a second phase of the two phases, the measured AC current value falls more quickly than a predetermined threshold value when the second phase is put into contact with DC− by the inverter circuit;
   checking the assumption, the checking of the assumption comprising identifying whether a value of the identified rise in the first phase possibly affected by the short circuit corresponds to a value of the identified fall in the second phase possibly affected by the short circuit;
   when the assumption has been positively confirmed, checking whether a current sum of the three phases is still unchanged; and
   establishing the inverter short circuit when the two checkings are positive; and modifying a modulation of the inverter circuit such that all switch settings with a switch setting opposing the phases affected by the short circuit are avoided.

6. The method of claim 5, wherein, when modulating the inverter circuit, the method further comprises replacing space vector settings corresponding to the avoided switch settings with null vector settings.

7. An arrangement for identifying an inverter short circuit between two phases, the arrangement comprising:
- at least three AC current measurement units configured to measure and evaluate AC current values of all three phases;
- a current change value identification unit configured to identify values of a temporal current change based on the measured AC current values;
- a short circuit candidate identification unit configured to assume a short circuit between the two phases when, in a first phase of the two phases, the measured AC current value rises more quickly than a predetermined threshold value when the first phase is put into contact with DC+ by an inverter circuit and, in a second phase of the two phases, the measured AC current value falls more quickly than a predetermined threshold value when the second phase is put into contact with DC− by the inverter circuit;
- a first plausibility-checking unit configured to check the assumption, the check of the assumption comprising identification of whether the value of the identified rise corresponds to the value of the identified fall;
- a second plausibility-checking unit configured to check, in the event that the assumption has been positively confirmed, whether a current sum of the three phases is still unchanged; and
- a short circuit identification unit configured to establish the short circuit when the two checks are positive.

8. A reconfiguration arrangement comprising:
an arrangement for identifying an inverter short circuit between two phases, the arrangement comprising:
- at least three AC current measurement units configured to measure and evaluate AC current values of all three phases;
- a current change value identification unit configured to identify values of a temporal current change based on the measured AC current values;
- a short circuit candidate identification unit configured to assume a short circuit between the two phases when, in a first phase of the two phases, the measured AC current value rises more quickly than a predetermined threshold value when the first phase is put into contact with DC+ by an inverter circuit and, in a second phase of the two phases, the measured AC current value falls more quickly than a predetermined threshold value when the second phase is put into contact with DC− by the inverter circuit;
- a first plausibility-checking unit configured to check the assumption, the check of the assumption comprising identification of whether the value of the identified rise corresponds to the value of the identified fall;
- a second plausibility-checking unit configured to check, in the event that the assumption has been positively confirmed, whether a current sum of the three phases is still unchanged; and
- a short circuit identification unit configured to establish the short circuit when the two checks are positive; and
a modification unit configured to modify a modulation of the inverter circuit such that all switch settings with a switch setting opposing the phases affected by the short circuit are avoided.

9. In a non-transitory computer-readable storage medium that stores instructions executable by a computer unit to identify an inverter short circuit between two phases, the instructions comprising:
- measuring AC current values of all three phases;
- identifying values of a temporal current change based on the measured AC current values;
- assuming a short circuit between the two phases when, in a first phase of the two phases, the measured AC current value rises more quickly than a predetermined threshold value when the first phase is put into contact with DC+ by an inverter circuit and, in a second phase of the two phases, the measured AC current value falls more quickly than a predetermined threshold value when the second phase is put into contact with DC− by the inverter circuit;
- checking the assumption, the checking of the assumption comprising identifying whether a value of the identified rise in the first phase possibly affected by the short circuit corresponds to a value of the identified fall in the second phase possibly affected by the short circuit;
- when the assumption has been positively confirmed, checking whether a current sum of the three phases is still unchanged; and
- establishing the inverter short circuit when the two checkings are positive.

10. The non-transitory computer-readable storage medium of claim 9, wherein, in the checking of the current sum for the case of an IT network, the method further comprises checking whether the current sum of all of the three phases gives a value 0.

11. The non-transitory computer-readable storage medium of claim 9, wherein, in the checking of the current sum for the case of a network with a neutral conductor, the method further comprises checking whether the current sum of all of the three phases gives an unchanged value, already occurring before the assumed short circuit, of other than 0.

12. The non-transitory computer-readable storage medium of claim 9, wherein the inverter short circuit is located between phases of the three phases for which a value of the identified rise in the AC current in one phase corresponds to a value of the identified fall in the current in the other phase.

* * * * *